(12) United States Patent
Guo et al.

(10) Patent No.: US 7,764,539 B2
(45) Date of Patent: Jul. 27, 2010

(54) SPIN TRANSFER MRAM DEVICE WITH SEPARATED CPP ASSISTED WRITING

(75) Inventors: Yimin Guo, San Jose, CA (US); Jeff Chien, Saratoga, CA (US)

(73) Assignee: MagIC Technologies, Inc., Milpitas, CA (US)

(*) Notice: Subject to any disclaimer, the term of this patent is extended or adjusted under 35 U.S.C. 154(b) by 0 days.

(21) Appl. No.: 12/462,462

(22) Filed: Aug. 4, 2009

(65) Prior Publication Data

US 2009/0296456 A1 Dec. 3, 2009

Related U.S. Application Data

(62) Division of application No. 11/986,375, filed on Nov. 21, 2007, now Pat. No. 7,577,021.

(51) Int. Cl.
*G11C 11/00* (2006.01)

(52) U.S. Cl. .................. 365/158; 365/148; 365/173; 365/225.5; 365/243.5; 977/935

(58) Field of Classification Search .............. 365/80, 365/83, 85, 148, 158, 171, 173; 257/421, 257/E21.665; 438/3; 977/933–935
See application file for complete search history.

(56) References Cited

U.S. PATENT DOCUMENTS

| | | | |
|---|---|---|---|
| 5,695,864 A | 12/1997 | Slonczewski | |
| 5,930,164 A | 7/1999 | Zhu | |
| 6,532,164 B2 | 3/2003 | Redon et al. | |
| 6,927,948 B2 * | 8/2005 | Gill | 360/314 |
| 7,009,877 B1 * | 3/2006 | Huai et al. | 365/171 |
| 7,095,648 B2 * | 8/2006 | Ditewig et al. | 365/158 |
| 7,149,106 B2 | 12/2006 | Mancoff et al. | |
| 7,173,848 B2 | 2/2007 | Ju | |
| 7,230,844 B2 | 6/2007 | Deak | |
| 7,577,021 B2 | 8/2009 | Guo et al. | |
| 2006/0146597 A1 | 7/2006 | Lenssen et al. | |
| 2006/0202244 A1 | 9/2006 | Ju et al. | |

(Continued)

OTHER PUBLICATIONS

"Direct-Current Induced Dynamics in Co90Fe10/Ni80Fe20 Point Contacts," by W. H. Rippard et al., Physical Review Letters, vol. 92, No. 2, Jan. 16, 2004, pp. 027201-1 to 027201-4.

(Continued)

*Primary Examiner*—Richard Elms
*Assistant Examiner*—Harry W Byrne
(74) *Attorney, Agent, or Firm*—Saile Ackerman LLC; Stephen B. Ackerman

(57) ABSTRACT

A spin-transfer MRAM is described that has two sub-cells each having a conductive spacer between an upper CPP cell and a lower MTJ cell. The two conductive spacers in each bit cell are linked by a transistor which is controlled by a write word line. The two CPP cells in each bit cell have different resistance states and the MTJ cell and CPP cell in each sub-cell have different resistance states. The MTJ free layer rotates in response to switching in the CPP free layer because of a large demagnetization field exerted by the CPP free layer. An improved circuit design is disclosed that enables a faster and more reliable read process since the reference is a second MTJ within the same bit cell. When $R_{MTJ1} > R_{MTJ2}$, the bit cell has a "0" state, and when $R_{MTJ1} < R_{MTJ2}$, the bit cell has a "1" state.

5 Claims, 4 Drawing Sheets

U.S. PATENT DOCUMENTS

2007/0133251 A1    6/2007    Carey et al.
2007/0183187 A1    8/2007    Guo

OTHER PUBLICATIONS

"Current-driven excitation of magnetic multilayers," by J.C. Slonczewski, Journal of Magnetism and Magnetic Maerials 159 (1996) L1-L7, Elsevier Science B.V., Jun. 15, 2006.

"Spin-current interaction with a monodomain magnetic body: A model study," by J. Z. Sun, Physical Review B, vol. 62, No. 1, Jul. 1, 2000-I, pp. 570-578.

"Analytical investigation of spin-transfer dynamics using a perpendicular-to-plane polarizer," by K. J. Lee et al., Applied Physics Letters 86, (2005), pp. 022505-1 to 022505-3, Jun. 3, 2005.

* cited by examiner

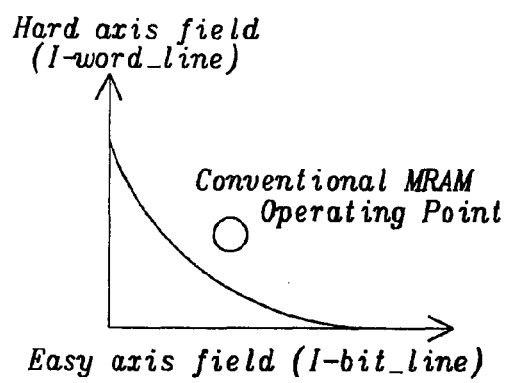
FIG. 1a - Prior Art
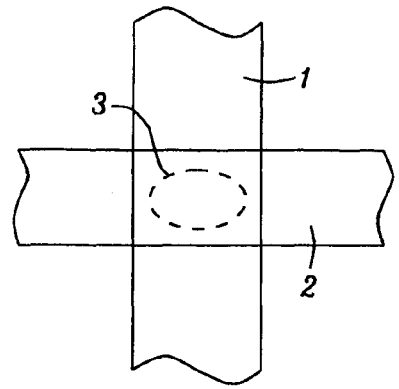
FIG. 1b - Prior Art
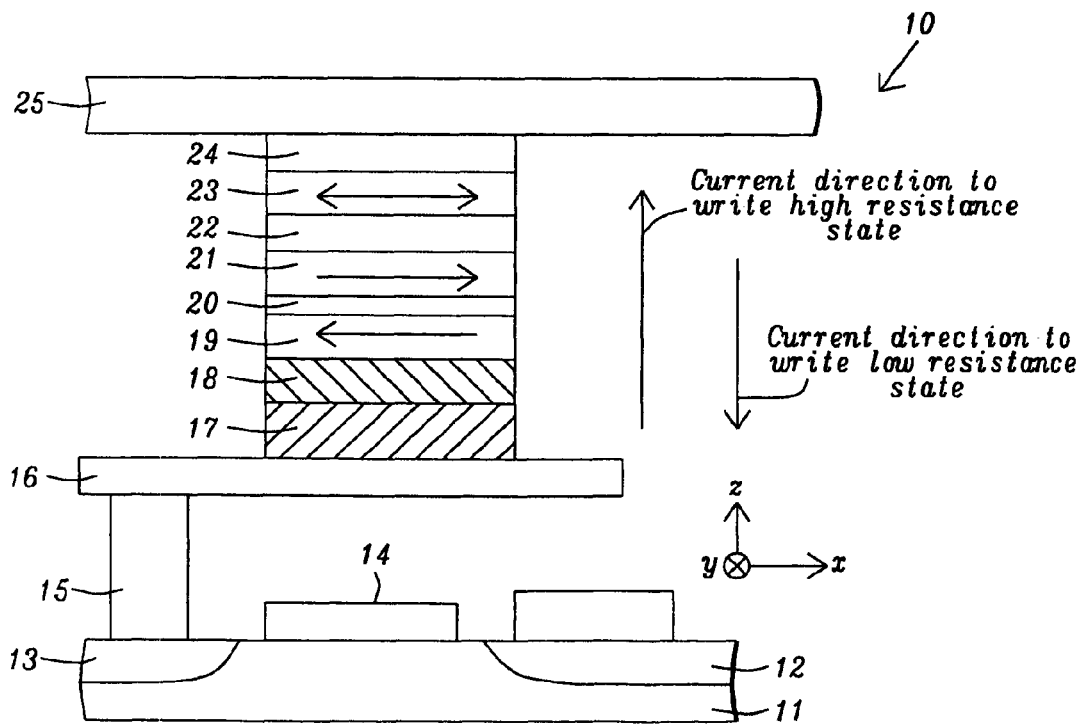
FIG. 2 - Prior Art

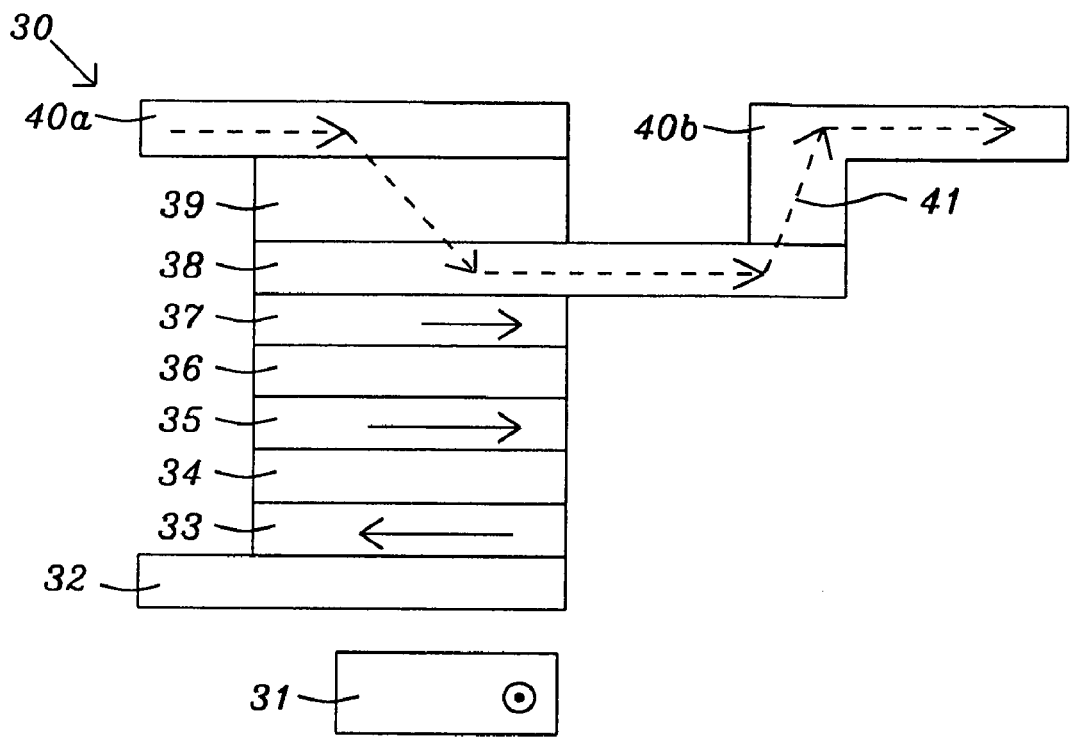
FIG. 3 – Prior Art
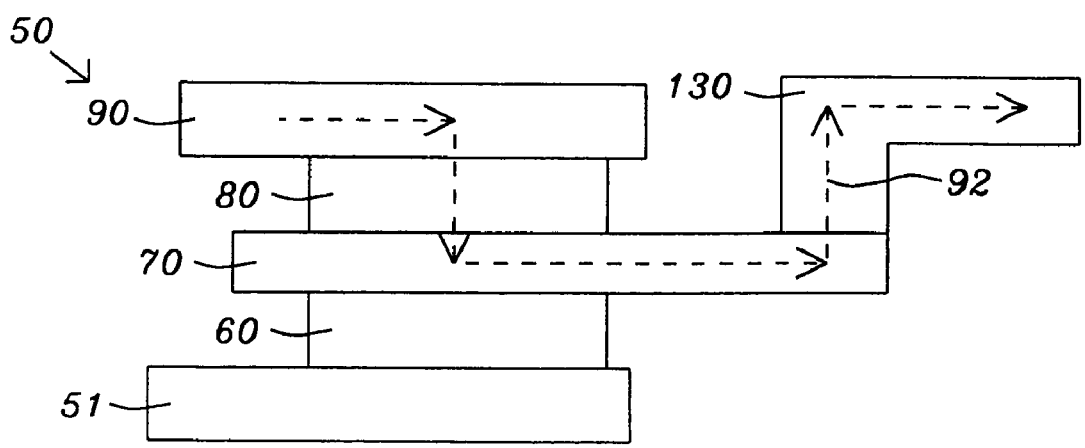
FIG. 4a

SPIN TRANSFER MRAM DEVICE WITH SEPARATED CPP ASSISTED WRITING

This is a Divisional application of U.S. patent application Ser. No. 11/986,375, filed on Nov. 21, 2007 now U.S. Pat. No. 7,577,021, which is herein incorporated by reference in its entirety, and assigned to a common assignee.

FIELD OF THE INVENTION

The invention relates to a spin-transfer MRAM cell in which an upper CPP cell is separated from a lower MTJ cell by a conducting layer in order to form different read and write paths, and each bit cell has two spin-transfer MRAM cells that are written into opposite resistance states.

BACKGROUND OF THE INVENTION

Magnetoresistive Random Access Memory (MRAM), based on the integration of silicon CMOS with magnetic tunnel junction (MTJ) technology, is a strong candidate to provide a dense (8-25 $F^2$ cell size), fast (1~30 ns read/write speed), and non-volatile storage solution for future memory applications. The MTJ utilizes a thin dielectric insulating layer like AlOx, AlNxOy, or MgOx that is formed between a first ferromagnetic layer which is pinned in a certain direction by an adjacent anti-ferromagnetic (AFM) layer, and a second ferromagnetic (free) layer. The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

A MRAM device is generally comprised of an array of parallel first conductive lines on a horizontal plane, an array of parallel second conductive lines on a second horizontal plane spaced above and formed in a direction perpendicular to the first conductive lines, and a MTJ cell interposed between a first conductive line (i.e. word line) and a second conductive line (i.e. bit line) at each crossover location. In a read operation, the information stored in a MRAM is read by sensing the magnetic state (resistance level) of the MTJ cell through a sense current flowing top to bottom through the cell in a current perpendicular to plane (CPP) configuration. During a write operation, information is written to the MRAM by changing the magnetic state in the free layer to an appropriate one by generating external magnetic fields as a result of applying bit line and word line currents in two crossing conductive lines, either above or below the MTJ cell. Thus, the cross point of word line and bit line currents is used to program a MTJ cell. In FIG. 1a, a switching field asteroid is depicted for a conventional MRAM and in FIG. 1b, a bit line 1 is shown crossing over a MTJ cell 3 and a word line 2 that is below the MTJ cell.

The problem of MTJ cells being disturbed along the same word line and bit lines is a major concern. Switching fields generated by word line and bit line currents for the conventional MRAM are about 30 to 60 Oe in intensity. The MRAM has to generate a relatively large electric current magnetic field to rewrite recorded information. Hence, an electric current of a certain large magnitude should flow through the address wirings in order to produce a sufficient magnetic field for the write process.

As memory devices are increasingly micro-miniaturized, the address wiring is also reduced in width so that it becomes difficult to apply a sufficient electric current to the address wiring. Additionally, coercive force of the device is increased thereby leading to a greater electric current magnetic field and a higher power consumption in the device. For this reason, a memory structure that employs magnetization switching driven by a spin transfer mechanism is receiving more attention as a configuration capable of switching the magnetization direction by application of a small electric current.

Spin transfer (spin torque) magnetization switching is described in detail by J. Slonczewski in U.S. Pat. No. 5,695,864 and by Redon et al. in U.S. Pat. No. 6,532,164. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. For example, when spin-polarized electrons are passed through a magnetic layer having a particular magnetic moment in a preferred easy axis direction, these spin-polarized electrons will cause a continuous rotation of the magnetic moment vector which may result in a reversal of the magnetic moment vector along its easy axis. Thus, switching the magnetic moment vector between its two preferred directions along the easy axis may be effected by passing spin-polarized electrons perpendicularly through the magnetic layer. The difference between a Spin-RAM and a conventional MRAM is only in the write operation mechanism. The read mechanism is the same.

Recent experimental data from W. Rippard et al. in Phys. Rev. Lett., 92, p. 027201[3] (2004) confirms the very essence of magnetic moment transfer as a source of magnetic excitations, and subsequently, switching. These experiments also confirm theoretical predictions by J. Slonczewski in "Current-driven excitation of magnetic multilayers", J. Magn. Magn. Materials V 159, L1-L7 (1996), and by J. Sun in Phys Rev. B, Vol. 62, p. 570[5] (2000), stating that the spin-transfer generated net torque term ($\Gamma$) acting on the magnetization under conditions of spin-polarized DC current is expressed by the equation: $\Gamma = s\, n_m \times (n_s \times n_m)$ where s is the spin-angular momentum deposition rate, $n_s$ is a unit vector whose direction is that of the initial spin direction of the current, and $n_m$ is a unit vector whose direction is that of the free layer magnetization. The above equation indicates that the torque will have a maximum value when $n_s$ is orthogonal to $n_m$.

Referring to FIG. 2, a prior art spin-transfer MRAM, also referred to as a Spin-RAM, is depicted from a cross-sectional view. The storage element (MTJ) 10 is formed between a bottom electrode 16 and a top electrode (bit line) 25 and is comprised of an underlayer 17, an AFM layer 18, synthetic anti-ferromagnetic (SYAF) reference layer made of layers 19-21, a tunnel barrier layer 22, a free storage layer 23, and a capping layer 24. The bottom electrode 16 is connected to a CMOS transistor having a source 12, drain 13, and p-type semiconductor substrate 11 that provides current for switching the MTJ free layer 23. For data writing, as a current flowing across the storage element from bottom to top reaches a critical current, the magnetization of the free layer 23 will be written to be anti-parallel to the magnetization direction of the reference layer (i.e. a high resistance state). As a current flowing across the storage element from top to bottom reaches a critical current, the magnetization of the free layer 23 will be written to be parallel to that of the reference layer (i.e. a low resistance state). During the read process, a small current flows across the MTJ cell and its resistance is compared with a pre-written MTJ cell (called a reference cell) to determine whether it is in a high resistance state or low resistance state. Typically, the read margin is determined by the ratio between the magnetoresistive ratio (dR/R), and the coefficient of resistance variance ($\sigma/\mu$) which is the ratio between the resistance standard deviation $\sigma$ and the resistance mean value $\mu$.

A critical current for spin transfer switching (Ic), which is defined as $[(Ic^{+}+|Ic^{-}|)/2]$, for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier layer such as AlOx, MgO, or the like. In order for spin-transfer magnetization switching to be viable in the 90 nm technology node and beyond, the critical current density (Jc) must be lower than $10^6$ A/cm$^2$ to be driven by a CMOS transistor that can typically deliver 100 μA per 100 nm gate width. For Spin-RAM applications, the (ultra-small) MTJs must exhibit a high tunnel magnetoresistance ratio (TMR or dR/R) much higher than the conventional MRAM-MTJ that use AlOx as a barrier layer. To apply spin-transfer switching to MRAM technology, it is desirable to decrease Ic (and its Jc) by more than an order of magnitude so as to avoid an electrical breakdown of the MTJ device and to be compatible with the underlying CMOS transistor that is used to provide switching current and to select a memory cell.

Normally, the write current density required to switch free layer magnetization is mainly determined by the MTJ free layer magnetization moment, damping ratio, and spin-angular momentum deposition rate which depends on the type and quality of the materials used in the MTJ stack of layers. As the device is micro-miniaturized to nanometer scale dimensions, the write current density is unchanged, giving a much smaller write current which is scalable to the shrinking MTJ dimensions. Hence, power consumption of the device is reduced.

Since write current also flows across the MTJ tunnel barrier layer, the reliability of MTJ cells becomes a large problem due to the fact that the MTJ will be damaged as the voltage across a MTJ junction reaches a threshold, the so-called breakdown voltage. In order to solve this problem, a new design has been proposed in U.S. Pat. No. 7,149,106 that is illustrated in FIG. 3. During the write process, a magnetic field from a digit line 31 rotates the magnetization in a polarizer 39 toward one direction which the magnetization of the free layer 37 is written to, and an electric current 41 flows only from one section 40a of the write line across the polarizer 39 and returns to a second section 40b of the write line through a conducting spacer 38. The write current 41 generates a spin-transfer interaction between the magnetic polarizer 39 and free layer 37 thereby causing a switch in free layer magnetization. The MTJ cell 30 is also comprised of an AFM/bottom electrode 32, AP2 layer 33, Ru coupling layer 34, AP1 layer 35, and a tunnel barrier layer 36.

Since the write current does not directly flow into the free layer in this design, only a very small surface portion of the free layer magnetization may experience a spin-transfer effect. Moreover, the conducting spacer must be made very thin in order to deliver polarized spin current to free layer magnetization more efficiently. Even so, the spin-transfer effect could still be very small. Thus, a large write current would be required. Additionally, a thin conducting spacer is very difficult to fabricate and a high current density flowing along the spacer layer would likely cause a reliability problem.

Therefore, an improved design is needed for a Spin-RAM that avoids an operating voltage which could damage the MTJ tunnel barrier while providing a low write current, and high dR/R. Also, as the MRAM dimension shrinks, it is becoming increasingly difficult during a read process to differentiate between a "0" and a "1" state when comparing the resistance in the MTJ cell to a reference cell in the periphery of the circuit. Ideally, a better method is needed that does not rely on a reference cell outside the bit so that the reliability of the read process is improved and the "read" time is minimized.

A routine search of the prior art was conducted and the following references were found. U.S. Pat. No. 7,173,848 discloses a stack of two memory cells separated by a non-magnetic layer. In related U.S. Patent Application No. 2006/0202244, there are memory stacks in an X-Y plane where each stack has two memory cells stacked along a Z-axis direction.

U.S. Pat. No. 5,930,164 shows a stack of two memory cells where the bottom cell is larger and the two cells are separated by a conductive layer made of Cu.

In U.S. Pat. No. 6,927,948, two differential CPP cells are stacked together and are separated by a metal gap layer.

U.S. Patent Application 2006/0146597 discloses a security device comprising two paired MRAM cells.

U.S. Pat. No. 7,095,648 describes a matrix of memory cells arranged in rows and columns where one cell in a column (or row) is read while another cell in the same column (or row) is written simultaneously.

U.S. Pat. No. 7,009,877 discloses a magnetic memory device having three terminals in which a spin transfer (ST) driven element is formed between a first terminal and a second terminal, and a MTJ element is disposed between the second terminal and a third terminal. Magnetization reversal of a first free layer within the ST element causes the magnetization direction in a second free layer within the MTJ to switch and thereby records a data state. However, this reference does not teach how the interaction between the two free layers can be optimized to improve switching efficiency. Moreover, the memory device relies on a reference cell outside the bit cell during the read process which can slow the device speed.

U.S. Pat. No. 7,230,844 states that a thermal factor represented by $K_U M_S V/k_B T$ where $K_U$ is the anisotropy constant, Ms is the saturation magnetization, V is the volume of the FM2 free layer, $k_B$ is the Boltzmann constant, and T is the temperature, should be greater than 40 to assure a minimum length for data retention of 10 years in a magnetic material memory element.

SUMMARY OF THE INVENTION

One objective of the present invention is to provide a Spin-RAM design which leads to an improved interaction between a free layer in a CPP cell that operates by a spin transfer effect and a free layer in an underlying MTJ cell to increase read and write efficiency compared with the prior art.

A second objective of the present invention is to provide a Spin-RAM circuit employing a plurality of Spin-RAM cells according to the first objective to achieve two Spin-RAM cells and two MTJ cells per bit cell and allow one MTJ cell to serve as a reference while reading the second MTJ, thereby avoiding an external reference cell.

According to one embodiment, a more efficient Spin-RAM device is achieved with a bit cell configuration comprised of two CPP/MTJ sub-cells in which the two CPP/MTJ cells in each bit pair are written to opposite resistance states represented by (0,1) and (1,0). Each CPP/MTJ sub-cell has a stack comprised of a MTJ cell formed on a bottom electrode, a conductive spacer contacting the capping layer in the MTJ, a CPP cell formed on the conductive spacer, and a bit line contacting a capping layer in the CPP cell. Preferably, a first free layer in the MTJ cell has a small anisotropy of less than 5 Oe while a second free layer in the CPP cell has a large uniaxial anisotropy of at least 50 Oe or about 10× that of the first free layer. Thus, the large demagnetization field from the second free layer will easily switch the magnetic moment in the first free layer so that their magnetization directions are anti-parallel and will remain anti-parallel when the second free layer magnetization is switched during a write process. On the other hand, the first free layer will exert a relatively small field on the second free layer so as not to stabilize the CPP free layer. Consequently, the spin transfer switching of the second free layer by a write current can occur more easily than when the anisotropy of the first free layer and second free layer are closely matched. Furthermore, the anisotropy of the second free layer is large enough to assure a thermal factor $K_U M_S V/k_B T > 40$, where $K_U$ is the anisotropy constant, $M_S$ is the saturation magnetization, V is the second free layer volume, $k_B$ is the Boltzmann constant, and T is temperature.

The write current passes from a first bit line through a first CPP cell within the first CPP/MTJ sub-cell and into the conductive spacer which is connected through a transistor to a conductive spacer in a second CPP cell within a second CPP/MTJ sub-cell. In the second CPP cell, the write current passes from the conductive spacer through the second CPP cell to a second bit line that is grounded. The transistor is controlled by a write word line. When the magnetization in the second free layer in a CPP/MTJ sub-cell is switched by the write current, magnetic coupling will force the first free layer to switch magnetization as well and thereby remain anti-parallel to the magnetization in the second free layer. A high write current does not pass through the MTJ cell and avoids a tunnel barrier breakdown issue that has affected earlier Spin-RAM designs.

The bottom electrode in each CPP/MTJ sub-cell is connected to ground through a read transistor that is controlled by a read word line. During a read process, the first bit line and second bit line are biased at a certain voltage and when the read word line is turned on, a sense amplifier is used to sense the resistance difference between the first MTJ cell and the second MTJ cell. If the first MTJ cell has a resistance less than that of the second MTJ cell, then the bit cell is said to have a "1" memory state. When the first MTJ cell has a resistance greater than that of the second MTJ cell, the bit cell is said to have a "0" memory state.

The MTJ cell, conductive spacer, and CPP cell in each CPP/MTJ sub-cell may be sequentially formed on the bottom electrode by a sputter deposition process. Preferably, each MTJ cell is comprised of a seed layer, AFM layer, pinned layer, tunnel barrier layer, free layer, and a capping layer that are sequentially formed on a bottom electrode. The tunnel barrier layer may be an AlOx or MgOx layer, for example, that is formed by oxidizing an Al or Mg layer in an oxidation chamber within a sputter deposition tool. Each CPP cell has a stack including a seed layer, free layer, spacer, pinned layer, AFM layer, and capping layer formed sequentially from bottom to top on the conductive spacer.

The present invention anticipates that the CPP cell and MTJ cell may be independently optimized so as to achieve a low write current in the CPP cell and a high dR/R in the MTJ. For instance, the CPP cell preferably has a larger size than the MTJ cell in order to take advantage of a large demagnetization field from the CPP free layer and thereby more efficiently switch the magnetic state in the MTJ free layer. Furthermore, the CPP cell may have a different shape than the MTJ cell. In one embodiment, the CPP cell has a large shape anisotropy derived from an elliptical or eye shape while the MTJ cell has an essentially round shape to promote a low anisotropy. A MTJ stack of layers may be laid down and patterned to form a MTJ cell followed by formation of a first dielectric layer adjacent to the MTJ cell. Subsequently, a second dielectric layer may be formed on the first dielectric layer and then the conductive spacer and write word line may be formed in the second dielectric layer. Thereafter, the CPP stack is deposited and patterned to form a CPP cell on the conductive spacer. Next, a third dielectric layer is deposited and made coplanar with the CPP cell. The bit line is then formed on the CPP cell by a conventional method.

The present invention also encompasses an embodiment wherein one or both of the CPP cell and MTJ cell have a dual spin valve configuration.

BRIEF DESCRIPTION OF THE DRAWINGS

FIG. 1a is a graph depicting a switching field asteroid for a conventional MRAM while FIG. 1b is a top view showing a conventional memory cell with a MTJ cell formed between a bit line and a word line.

FIG. 2 is cross-sectional view of a prior art Spin-RAM device.

FIG. 3 is a cross-sectional view of a prior art Spin-RAM structure in which a conductive spacer carries a write current between bit lines and produces a spin transfer interaction between a magnetic polarizer and a free layer in a MTJ element.

FIG. 4a depicts a CPP/MTJ sub-cell according to one embodiment of the present invention and shows the direction of write current through a conductive spacer between a CPP cell and a MTJ cell to an adjacent CPP/MTJ sub-cell within the same bit cell.

FIG. 4b is a cross-sectional view of a MTJ cell in the CPP/MTJ sub-cell of FIG. 4a and FIG. 4c is a cross-sectional view of a CPP cell in the CPP/MTJ sub-cell of FIG. 4a.

DETAILED DESCRIPTION OF THE INVENTION

Figure 4B:
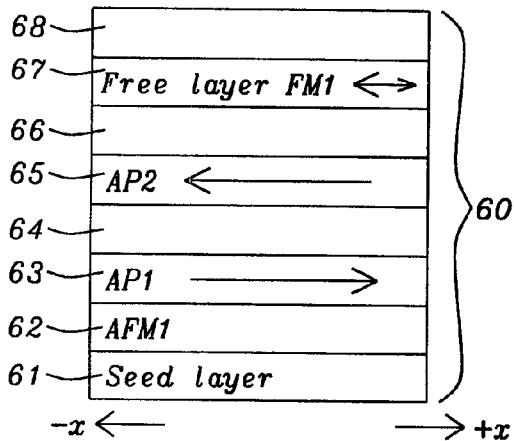

One aspect of the present invention is a CPP/MTJ sub-cell configuration within a Spin-RAM device that provides for a separation of write and read pathways so that the writing process and reading process can be independently optimized. In the CPP and MTJ cells, the exemplary embodiment depicts a single spin valve structure. However, the present invention also encompasses a CPP/MTJ sub-cell wherein one or both of the CPP cell and MTJ cell have a dual spin valve configuration. Devices based on this technology may be referred to as Spin-RAM or spin-transfer MRAM devices. Another aspect of the present invention is a wiring scheme comprised of a plurality of bit cells, word lines, and bit lines that takes advantage of a pair of CPP/MTJ sub-cells within each bit cell which enables the reading process to be more efficient. Those skilled in the art will appreciate that the terms "magnetic moment" and "magnetization direction" may be used interchangeably.

First, the CPP/MTJ sub-cell structure will be described. Referring to FIG. 4a, a cross sectional view of a Spin-RAM structure 50 is shown that includes a bottom electrode 51 formed on a substrate (not shown), a MTJ cell 60 on the bottom conductor, a conductive spacer 70 on the top surface of the MTJ cell, a CPP cell 80 on the conductive spacer, and a bit line 90 above the conductive spacer. The spin transfer effect that switches the magnetic direction of a free layer within the CPP cell 80 is generated by a write current 92 that flows from the bit line 90 through the CPP cell 80 and into the conductive spacer 70. The write current 92 is carried to an adjacent CPP/MTJ sub-cell (not shown) within the same bit cell through a transistor 130.

Referring to FIG. 4b, the MTJ cell 60 is shown. In one embodiment, the MTJ cell 60 has a bottom spin valve configuration in which a seed layer 61, AFM1 layer 62, AP1 layer 63, coupling layer 64, AP2 layer 65, tunnel barrier layer 66, free layer (FM1) 67, and capping layer 68 are sequentially formed on the bottom electrode (not shown). The bottom electrode 51 and MTJ stack of layers 61-68 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode 51 and overlying MTJ layers may be formed after a single pump down of the sputter system to enhance throughput.

The seed layer 61 may be made of NiCr or other suitable materials such as NiFe, or NiFeCr that promotes a smooth and densely packed growth in subsequently formed MTJ layers.

The AFM layer 62 may be comprised of MnPt or other suitable materials such as IrMn, NiMn, OsMn, RuMn, RhMn, PdMn, RuRhMn, or MnPtPd that are effective in pinning the adjacent AP1 layer 63 in a certain direction which is the x-axis in the exemplary embodiment. Thus, when the AFM layer 62 is magnetically aligned in the x-axis direction, the AP1 layer 63 will also be pinned in the x-axis direction.

The AP1 layer 63, coupling layer 64, and AP2 layer 65 form a synthetic anti-ferromagnetic (SyAF) pinned layer. Use of a SyAF pinned layer in the MTJ cell not only improves thermal stability but also reduces the interlayer coupling field (offset field) applied to the free layer (FM1) 67. Both the AP1 layer 63 and AP2 layer 65 may be comprised of CoFe, for example. The magnetic moment of the AP2 layer 65 is pinned in a direction anti-parallel to the magnetic moment of the AP1 layer 63. A slight difference in thickness between the AP2 and AP1 layers produces a small net magnetic moment for the SyAF pinned layer along the x-axis. Exchange coupling between the AP1 layer 63 and the AP2 layer 65 also known as the reference layer is facilitated by a coupling layer 64 that is preferably comprised of Ru.

Above the AP2 layer 65 is formed a thin tunnel barrier layer 66 that may be made of AlOx, AlTiOx, or MgOx, for example. Generally, MgOx is preferred because the combination of a CoFeB AP2 layer 65 and a MgOx tunnel barrier 66 yields a higher dR/R than achieved with other tunnel barrier layers. Unlike a method commonly used in the prior art where a MgOx tunnel barrier is formed by a sputter deposition method, the inventors advantageously employ a procedure where a Mg layer about 6 to 8 Angstroms thick is deposited followed by an in-situ radical oxidation (ROX) or natural oxidation (NOX), and then deposition of an additional Mg layer about 2 to 6 Angstroms thick. The tunnel barrier layer 66 has excellent smoothness and uniformity in part because of the smooth underlying MTJ layers. The ROX or NOX process is preferably performed in an oxidation chamber within the sputter deposition system. In one embodiment, the ROX process is comprised of a RF power of about 300 to 500 Watts and an oxygen flow rate of 0.4 to 0.8 standard liters per minute (slm) and preferably about 0.6 slm for a period of about 15 to 50 seconds. Optionally, the NOX process may be comprised of a 1 torr pressure and an oxygen flow rate of from 0.1 to 1 slm, and preferably about 1 slm for about 60 to 120 seconds to oxidize the Mg layer on the AP2 layer 65. The process conditions for the ROX and NOX processes are selected to achieve a certain RA value specified in the design of a MTJ cell. Typically, if a low RA of less than about 10 ohm-um$^2$ is desired, then a NOX process is selected. One or both of the oxygen flow rate and process time may be decreased within the ranges mentioned above to decrease the RA value.

The free layer (FM1) 67 may be a single layer or a composite comprised of soft magnetic materials such as an alloy or ternary of Ni, Fe, Co, and B. The free layer 67 has a magnetic moment that may be aligned along the -x axis or +x-axis direction depending on the state to which it is written to. A lower resistance state is observed when the magnetic moment of the AP2 layer 65 and free layer 67 are aligned in the same direction. An important feature of the present invention is that the free layer 67 preferably has a low anisotropy of <10 Oe, and more preferably <5 Oe so that the first free layer (FM 1) does not exert a strong demagnetization field on the second free layer (FM2 in FIG. 4c) and thereby stabilize the FM2 free layer 82 which would make spin-transfer switching by a write current more difficult. Furthermore, a low anisotropy enables the FM1 free layer 67 to be more easily rotated under the influence of the FM2 free layer 82 when the latter is switched during a spin-transfer write process. Since the shape of a MTJ cell is typically one of the key factors in determining anisotropy in the FM1 free layer 67 (besides the material selection), a substantially circular cell shape is preferred in order to achieve an anisotropy of <5 Oe. It should be understood that an elliptical shape, eye shape, or other rounded shape cell are likely to lead to a higher anisotropy than desired. However, non-circular shapes are not precluded from being used in this embodiment because certain conditions wherein a first axis is slightly elongated compared with a second axis in the non-circular shape may still afford a low anisotropy of <5 Oe, or at least <10 Oe.

Preferably, the capping layer 68 is made of one or more of Ta, Ru, or other materials that enable the MTJ cell to achieve a high dR/R. A high temperature thermal annealing in the range of 250° C. to 350° C. is typically employed in the presence of a large external magnetic field of about 5000 to 10000 Oe to set the magnetization direction of the AFM1 layer 62. As a result, the magnetic moments of the AP1 layer 63 and AP2 layer 65 will also be set by influence from the AFM1 layer 62 and AP1 layer 63, respectively.

Returning to FIG. 4a, the conductive spacer 70 between the MTJ cell 60 and CPP cell 80 is made of a highly conductive material such as Cu, Au, Ag, or Al, for example. In an embodiment wherein the MTJ cell 60 and CPP cell 80 have different shapes, the conductive spacer 70 may have the same shape as either the MTJ cell or CPP cell. The conductive spacer 70 may be deposited by a physical vapor deposition (PVD) process in a sputter deposition chamber. A chemical mechanical polish (CMP) process may be employed to smooth the top surface of the conductive spacer 70 before the CPP stack of layers are laid down.

Figure 4C:
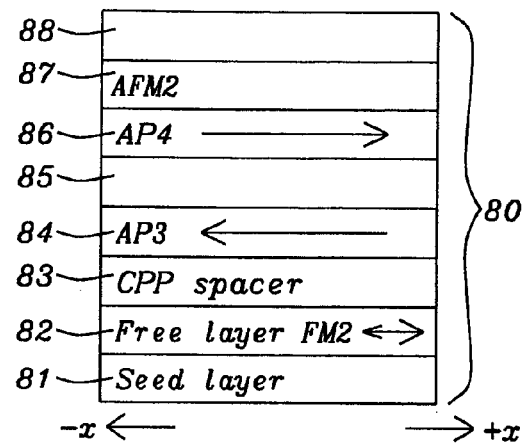

Referring to FIG. 4c, the CPP cell 80 is illustrated. In one embodiment, the CPP cell is comprised of a seed layer 81, FM2 free layer 82, CPP spacer 83, AP3 layer 84, coupling layer 85, AP4 layer 86, AFM2 layer 87, and a capping layer 88 formed in consecutive order from bottom to top on the conductive spacer 80. The capping layer 88 may be regarded as a top electrode. Preferably, the CPP cell 80 has a larger size from a top view (not shown) than the MTJ cell 60. A larger CPP size enables the FM2 free layer 82 to exert a larger demagnetization field on the FM1 free layer 67 (FIG. 4b) and make rotation of the FM1 free layer magnetization direction (switching) easier to accomplish during a write process. In addition, the shape of the CPP cell 80 from a top-down view is preferably elliptical, eye-shape, or another type of rounded shape that drives a high shape anisotropy in the FM2 free layer 82 which in turn causes a high demagnetization field on the FM1 free layer 67.

Preferably, the seed layer 81 is comprised of Cu, Au, Ag, Al, or other materials that are known in the art as non-spin sinkers. In other words, a non-spin sinker will improve (i.e. reduce) or at least not degrade the damping ratio of the FM2 free layer 82. The seed layer 81 also provides for better magnetic properties in overlying magnetic layers and a low damping ratio for the FM2 free layer 82.

Another key feature of the present invention is the FM2 free layer 82 which may be a single layer or a composite material. Preferably, the FM2 free layer 82 has a low damping ratio to promote the spin-transfer effect in the CPP cell 80 during a write process. Furthermore, the FM2 free layer 82 should have a substantial anisotropy that is sufficiently larger than that of the FM1 free layer 67 in order to exert a large demagnetization field on the FM1 free layer that will facilitate magnetization switching in the FM1 free layer when the magnetic moment of the FM2 free layer is reversed. In one embodiment, the FM2 free layer 82 preferably has an anisotropy >50 Oe, and more preferably >100 Oe which is achieved in part by an elliptical shape, eye shape, or another rounded shape as mentioned previously. Preferably, the FM2 free layer 82 anisotropy is from 3 to 1000 times greater than that of the FM1 free layer 67. Additionally, the FM2 free layer 82 anisotropy should be sufficiently large to assure a thermal factor $K_U M_S V/k_B T > 40$ where $K_U$ is the anisotropy constant, Ms is the saturation magnetization, V is the volume of the FM2 free layer, $k_B$ is the Boltzmann constant, and T is the temperature. A thermal factor greater than 40 is necessary to assure a minimum length for data retention of 10 years as stated previously.

The CPP spacer 83 is a non-magnetic material and is preferably a thin metallic layer such as Cu, Au, or other highly conductive materials having a thickness of about 20 to 100 Angstroms, and more preferably between 25 and 60 Angstroms, in order to provide better spin transfer efficiency which is equivalent to easier spin-transfer induced switching of the FM2 free layer 82 magnetization. If the CPP spacer 83 is less than about 20 Angstroms thick, then the spacer may not be sufficiently thick to prevent interdiffusion between the FM2 free layer 82 and AP3 layer 84. When the CPP spacer 83 is thicker than about 100 Angstroms, then an undesirable reduction in the degree of spin polarization occurs due to scattering.

Similar to the MTJ cell 60, the AP3 layer 84, coupling layer 85, and AP4 layer 86 form a SyAF pinned layer in which the AP3 layer serves as a reference layer for the CPP cell 80 and the AP4 pinned layer has a magnetic moment fixed in a certain direction by coupling with the adjacent AFM2 layer 87. In the exemplary embodiment, the magnetization direction of the AP3 layer 84 is along the −x axis, and the AP4 layer 86 and AFM2 layer 87 are magnetically aligned in the +x axis direction. The AP3 layer 84 and AP4 layer 86 may be a single layer or a composite of magnetic materials such as an alloy or ternary comprised of two or more of Ni, Fe, Co, and B. The magnetic moments of the AP3 layer 84 and AP4 layer 86 are nearly the same magnitude but aligned in opposite directions for the same reasons as described earlier with respect to AP1 layer 63 and AP2 layer 65. The coupling layer 85 may be made of Rh, Ru, or Ir. A high temperature thermal annealing in the range of 250° C. to 350° C. is typically employed in the presence of a large external magnetic field of about 5000 to 10000 Oe to set the magnetization direction of the AFM2 layer 87. Note that the annealing of the AFM2 layer 87 may be performed simultaneously with the annealing of AFM1 layer 62 since both are magnetically aligned in the +x-axis direction. The AFM2 layer 87 and capping layer 88 may be comprised of the same materials as in AFM1 layer 62 and capping layer 68, respectively.

In each bit sub-cell, the CPP cell is formed above the MTJ cell and has a larger area size from a top view (not shown) than the MTJ cell. The CPP cell from a top view preferably has an area 10% to 100% greater than that of the MTJ, and more preferably 30% to 60% greater than the MTJ cell area. Although the area size of the CPP cell relative to the MTJ cell is important, it should be understood that the shape of the area is also a critical factor in determining the magnitude of free layer anisotropy as described earlier. Both the shape and area size of the FM1 free layer 67 and FM2 free layer 82 are optimized to provide a FM2 free layer anisotropy that is preferably about 3 to 10 times greater than the FM1 free layer anisotropy, and more preferably about 3 to 1000 times greater than the FM1 free layer anisotropy. Since the FM2 free layer 82 (FIG. 4c) has a relatively large uniaxial anisotropy, its magnetization direction remains along the anisotropy axis, either parallel or anti-parallel to the AP3 layer 84 (reference layer) magnetization direction. Because the FM1 free layer 67 (FIG. 4b) has a relatively small anisotropy, the FM1 free layer experiences a demagnetization field from the FM2 free layer magnetization. Note that the magnetization of the FM1 free layer 67 will be anti-parallel to the magnetization of the FM2 free layer 87 and thus form a partial flux closure which is a magnetic coupling interaction.

To write data into a bit sub-cell 50 as shown in FIG. 4a, the electric current 92 is either injected from the bit line 90 and then flows across only the CPP cell 80 into conductive spacer 70 and then out through a write word line 110 to an adjacent bit sub-cell and out to another bit line (not shown), or in a reverse direction to current 92. When the free layer in CPP cell 80 is set along one of its anisotropy directions by spin-transfer induced switching, the demagnetization field from the CPP free layer will rotate the magnetization direction in the MTJ free layer to remain anti-parallel to the CPP free layer magnetization direction.

To read from a bit sub-cell 50, the read current flows from the bit line 90 to the bottom electrode 51. Although the CPP cell 80 and MTJ cell 60 are series connected, the resistance of the MTJ cell, which is several orders of magnitude larger than that of the CPP cell, is directly read and compared with a reference cell resistance.

One benefit of the CPP/MTJ sub-cell design of the present invention is that the write path and read path are separated so that a high write current does not flow across the MTJ cell and a key reliability problem in Spin-RAM related to tunnel barrier breakdown is no longer an issue. A second advantage is that the MTJ cell 60 can be optimized by selecting materials for the MTJ cell layers 61-68 to achieve a higher dR/R and lower resistance variance without concern for adversely affecting the tunnel barrier breakdown voltage, or the magnitude of the MTJ free layer damping ratio. Likewise, the CPP cell 80 can be independently optimized by selecting materials for the CPP cell layers 81-88 to achieve a lower damping ratio of the FM2 free layer 82 and a smaller switching current.

In one embodiment, the MTJ cell layers 61-68 may be sequentially formed in a sputter deposition tool and are then patterned by a conventional process. Next, a first dielectric layer (not shown) is deposited and polished by a chemical mechanical polish (CMP) process to be coplanar with the capping layer 68 in the MTJ cell 60. Subsequently, a second dielectric layer (not shown) may be formed on the first dielectric layer and then the conductive spacer 70 and write word line 110 wiring may be formed in the second dielectric layer by a well known process. A CMP process may be used to planarized the conductive spacer 70 and write word line 110. Thereafter, the CPP stack of layers 81-88 is formed on the conductive spacer 70 and is patterned by a conventional process to form the CPP cell 80. A third dielectric layer (not shown) is deposited and made coplanar with the CPP cell. The bit line 90 is then formed on the CPP cell 80 and third dielectric layer by a conventional method.

Figure 5:
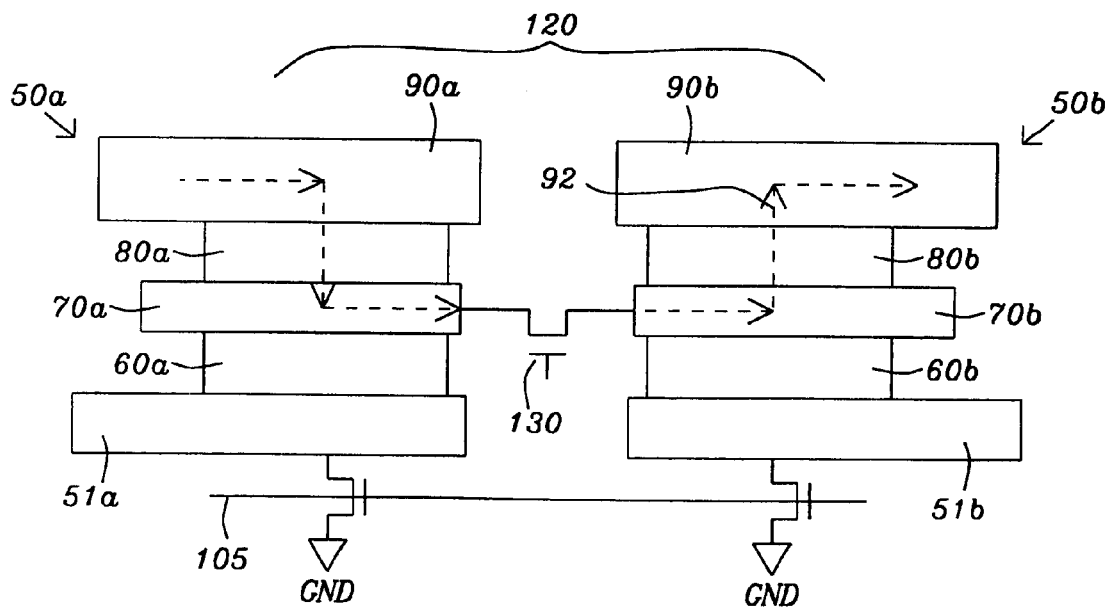
FIG. 5 is a cross-sectional view of two CPP/MTJ sub-cells in a bit cell according to the present invention and shows a write word line used to control a transistor that connects adjacent conductive spacers.

Another aspect of the present invention is to provide a Spin-RAM circuit that employs the CPP assisted writing scheme as described in a previous embodiment, and also includes an improved read architecture. Referring to FIG. 5, an improved read process is achieved by having two bit sub-cells 50a, 50b in each bit cell wherein a first bit sub-cell 50a is written to a "0" and a second bit sub-cell 50b is written to a "1" to yield a (0,1) resistance state for the bit cell 120. Alternatively, the first bit sub-cell 50a may be written to a "1" and the second bit sub-cell 50b may be written to a "0" to give a (1,0) resistance state. In the reading process, the resistance values are compared within each bit cell to determine the final bit state. In one embodiment, when the first bit sub-cell 50a has a greater resistance than the second bit sub-cell 50b, the bit cell 120 is said to have a "0" resistance state and when the first bit sub-cell 50a has a lower resistance than the second bit sub-cell 50b, the bit cell 120 has a "1" resistance state. This method of reading bit cell 120 has an advantage in read reliability and speed compared with prior art structures where a resistance in a certain bit cell is compared with the resistance in a reference cell that may be a substantial distance from the bit cell to be read.

The pathway of the write current 92 is illustrated in more detail in FIG. 5. In one embodiment, the write current 92 originates in bit line 90a and passes through the CPP cell 80 and conductive spacer 70a in the first bit sub-cell 50a before flowing out through transistor 130 and into a conductive spacer 70b in the second bit sub-cell 50b. Simultaneously, a current is injected to write word line (not shown) which controls transistor 130. The write current 92 and the current applied to write word line occur at the same time to force a current from conductive spacer 70a to conductive spacer 70b. The write current 92 flows from conductive spacer 70b up through CPP cell 80b and into bit line 90b. Alternatively, the write current 92 may flow in the opposite direction of write current 92 and move from bit line 90b to bit line 90a when a voltage is applied to transistor 130 that forces a current to flow from conductive spacer 70b to conductive spacer 70a as understood by those skilled in the art.

Figure 6:
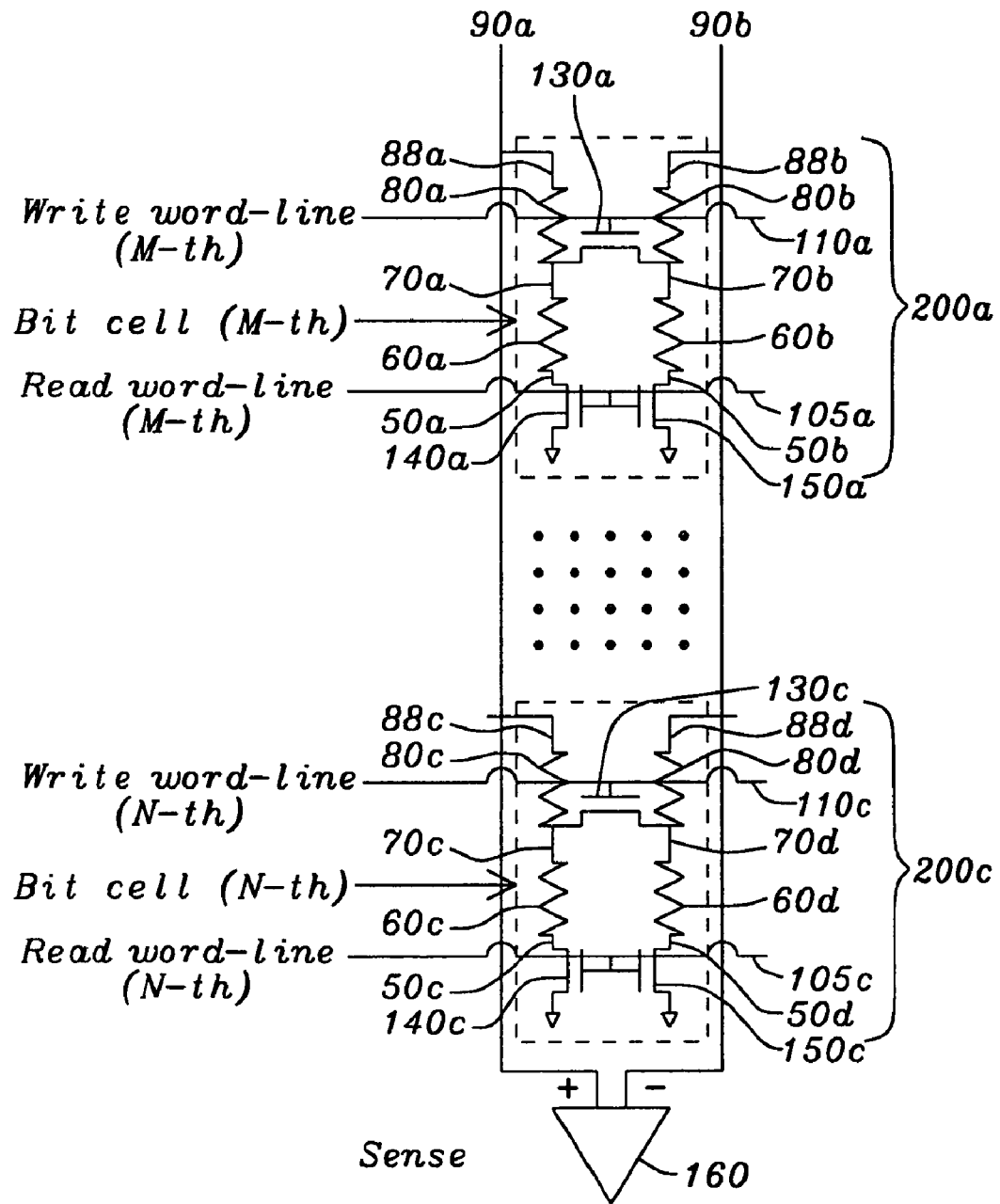
FIG. 6 is an electrical diagram showing two adjacent bit cells according to one embodiment of the present invention, and a sense amplifier used for the read process.

Referring to FIG. 6, an electrical diagram is provided that depicts two bit cells 200a, 200c which represent the Mth bit cell and Nth bit cell, respectively, in a Spin-RAM array comprised of a plurality of bit cells. The outer boundary of each bit cell is shown by the dashed lines. In bit cell 200a, there is a first sub-cell comprised of a first CPP cell 80a and a first MTJ cell 60a separated by a conductive spacer 70a, and there is a second sub-cell comprised of a second CPP cell 80b and a second MTJ cell 60b separated by a second conductive spacer 70b. A first write word line 110a controls a transistor 130a that connects the conductive spacers 70a, 70b. The bottom electrodes 50a, 50b in first and second sub-cells are connected through read transistors 140a, 150a, respectively, to ground. Orthogonal to the write word lines 110a, 110c direction are two bit lines 90a, 90b which are connected to the top electrodes (capping layers) 88a, 88b, respectively, in the first sub-cell and second sub-cell.

Bit cell 200c has a first sub-cell comprised of a third CPP cell 80c and a third MTJ cell 60c separated by a conductive spacer 70c, and there is a second sub-cell in bit cell 200c comprised of a fourth CPP cell 80d and a fourth MTJ cell 60d separated by a conductive spacer 70d. A second write word line 110c connects conductive spacers 70c, 70d and is controlled by a transistor 130c. The bottom electrodes 50c, 50d in the two sub-cells are connected through transistors 140c, 150c, respectively, to ground. Bit lines 90a, 90b are connected to the top electrodes (capping layers) 88c, 88d, respectively, in the first sub-cell and second sub-cell within bit cell 200c.

To write "1" to bit cell 200c, bit line 90a functions as a write current source while bit line 90b is grounded (not shown). When the write word line 110c is turned on, a write current (not shown) flows from bit line 90a through CPP cell 80c (from top to bottom) and then through CPP cell 80d (from bottom to top) and finally to bit line 90b. The write current also passes through conductive spacer 70c, write word line 110c, and conductive spacer 80c when flowing between CPP cell 80c and CPP cell 80d. Since the write current flows across CPP cells 80c, 80d in opposite directions, the CPP cells 80c, 80d are written to opposite magnetization states. Due to the demagnetization field exerted by CPP cells 80c, 80d, the MTJ cells 60c, 60d are rotated from a previous state and also have opposing magnetization directions. For example, when MTJ cell 60c has a higher resistance, MTJ cell 60d has a lower resistance. Therefore, writing a "1" to bit cell 200c results in resistance states for CPP cells 80c, 80d of "0" and "1", respectively, and resistance states for MTJ cells 60c, 60d of "1" and "0", respectively.

To write "0" to bit cell 200c, bit line 90b functions as a write current source while bit line 90a is grounded. When the write word line 10c is turned on, a write current flows from bit line 90b through CPP cell 90d (from top to bottom) and then through CPP cell 90c (from bottom to top), and finally to bit line 90c. Thus, the resistance states of CPP cells 80c, 80d are "1" and "0", respectively, and the resistance states of MTJ cells 60c, 60d, are "0" and "1", respectively, when the process of writing a "0" to bit cell 200c is completed.

To read data in the bit cell 200c, both bit line 90a and bit line 90b are biased at a certain voltage of about 0.05 to 0.5 volts. When the read word line 105c is turned on, the sense amplifier 160 is used to sense the difference in resistance between MTJ cell 60c and MTJ cell 60d. When the MTJ cell 60c has a greater resistance than the MTJ cell 60d, the bit cell 200c is said to have a "0" resistance state. On the other hand, when MTJ cell 60c has a lower resistance than MTJ cell 60d, the bit cell 200c is said to have a "1" resistance state. Therefore, the read process according to the present invention is greatly improved over the prior art by enabling a shorter read time and greater read reliability than conventional read schemes which rely on a reference cell outside the bit cell. In the prior art, the resistance (R1) of a MTJ cell is compared with the resistance (Rref) of a reference cell. A reference cell is specifically designed so that its resistance, Rref, is the averaged resistance value between the higher resistive state and the lower resistive state. A "1" resistance state is determined when (R1−Rref) is <0. Choosing the averaged resistance value between the higher resistive state and the lower resistive state as Rref can result in an absolute value for (R1−Rref) that is quite small and can easily cause a "1" state to be falsely read as a "0" state, or vice versa. Read error is substantially minimized in the embodiment described herein because the "0" and "1" states are determined by a simple $R_{MTJ1}>R_{MTJ2}$ or $R_{MTJ2}>R_{MTJ1}$ rather than measuring a certain magnitude of R1 and R2.

While this invention has been particularly shown and described with reference to, the preferred embodiment thereof, it will be understood by those skilled in the art that various changes in form and details may be made without departing from the spirit and scope of this invention.

We claim:

1. A method of writing a "0" resistance state to a bit cell in a spin-transfer MRAM structure wherein the bit cell is comprised of two sub-cells each having a CPP cell formed above a MTJ cell and connected through a conductive spacer, each of said MTJ cells has a first free layer with near zero anisotropy, and each of said CPP cells has a second free layer with a substantial anisotropy and a top electrode contacting a bit line, and a first conductive spacer in first sub-cell and a second conductive spacer in a second sub-cell are connected through a transistor, comprising:
   (a) injecting a write current into a first bit line contacting a top electrode in the CPP cell in the first sub-cell, said write current passes through the first CPP cell and into the first conductive spacer and then into the second conductive spacer and out through a second CPP cell to a second bit line contacting the top electrode in the second CPP cell to form a "0" resistance state in the first CPP cell, a "1" resistance state in the first MTJ cell, a "1" resistance state in the second CPP cell, and a "0" resistance state in the second MTJ cell; and
   (b) simultaneously applying a current to a write word line that controls a voltage to said transistor and causes current to flow from the first conductive spacer to the second conductive spacer.

2. A method of writing a "1" resistance state to a bit cell in a spin-transfer MRAM structure wherein the bit cell is comprised of two sub-cells each having a CPP cell formed above a MTJ cell and connected through a conductive spacer, each of said MTJ cells has a first free layer with near zero anisotropy, and each of said CPP cells has a second free layer with a substantial anisotropy and a top electrode contacting a bit line, and a first conductive spacer in first sub-cell and a second conductive spacer in a second sub-cell are connected through a transistor, comprising:
   (a) injecting a write current into a second bit line contacting a top electrode in the CPP cell in the second sub-cell, said write current passes through the second CPP cell and into the second conductive spacer and then into the first conductive spacer and out through a first CPP cell to a first bit line contacting the top electrode in the first sub-cell to form a "1" resistance state in the first CPP cell, a "0" resistance state in the first MTJ cell, a "0" resistance state in the second CPP cell, and a "1" resistance state in the second MTJ cell; and
   (b) simultaneously applying a current to a write word line that controls a voltage to said transistor and causes current to flow from the second conductive spacer to the first conductive spacer.

3. A method of reading a resistance state of a bit cell in a spin-transfer MRAM structure wherein the bit cell is comprised of two sub-cells each having a CPP cell formed above a MTJ cell and connected through a conductive spacer, each of said MTJ cells has a first free layer with near zero anisotropy and is formed on a bottom electrode that is grounded through a read transistor wherein said read transistors are controlled by a read word line, and each of said CPP cells has a second free layer with a substantial anisotropy and a top electrode connected to a bit line, and a first conductive spacer in first sub-cell and a second conductive spacer in a second sub-cell are connected through a transistor, comprising:
   (a) biasing a first bit line connected to a first CPP cell and biasing a second bit line connected to a second CPP cell with a certain voltage; and
   (b) applying a current to said read word line that applies a voltage to said read transistors and enables a sense amplifier to detect the resistance state in the MTJ cell in each sub-cell.

4. The method of claim 3 wherein said certain voltage used for biasing the first bit line a second bit line is from about 0.05 to 0.5 volts.

5. The method of claim 3 wherein a "0" resistance state for the bit cell is detected when the resistance in the MTJ in the first sub-cell is greater than the resistance of the MTJ in the second sub-cell, and a "1," resistance state for the bit cell is detected when the resistance in the MTJ in the second sub-cell is greater than the resistance of the MTJ in the first sub-cell.

* * * * *